United States Patent
Chen et al.

(12)

(10) Patent No.: US 6,555,277 B1
(45) Date of Patent: Apr. 29, 2003

(54) QUARTZ DAMAGE REPAIR METHOD FOR HIGH-END MASK

(75) Inventors: Same-Ting Chen, Hsinchu (TW); Tzy-Ying Lin, Hsinchu (TW); Wen-Rong Huang, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/134,822

(22) Filed: Apr. 26, 2002

(51) Int. Cl.$^7$ ................................................ G03F 9/00
(52) U.S. Cl. .......................................... 430/5; 430/311
(58) Field of Search .............................. 438/4; 430/311, 430/5

(56) References Cited

U.S. PATENT DOCUMENTS

| | | | |
|---|---|---|---|
| 5,789,117 A | * 8/1998 | Chen ............................ | 430/5 |
| 5,965,301 A | 10/1999 | Nara et al. ................... | 430/5 |
| 5,965,303 A | 10/1999 | Huang ........................... | 430/5 |
| 6,103,430 A | 8/2000 | Yang ............................ | 430/5 |
| 6,165,649 A | * 12/2000 | Grenon ......................... | 430/5 |
| 6,190,836 B1 | * 2/2001 | Grenon ....................... | 430/311 |

* cited by examiner

*Primary Examiner*—John F. Niebling
*Assistant Examiner*—Andre C Stevenson
(74) *Attorney, Agent, or Firm*—George O. Saile; Stephen B. Ackerman

(57) ABSTRACT

In accordance with the objectives of the invention a new method is provided for repairing photolithographic exposure masks. The invention uses an etch function of a conventional mask repair tool. The invention addresses defects that occur in a pattern of opaque material (such as chrome) created over the surface of an exposure mask whereby an (undesired) opening exists in the opaque material. The invention uses a focused E-beam exposure of the surface of the exposure mask to purposely "damage" this surface over the area where the opaque material is required to be present. Repair accuracy is in this manner easy to control, the conventional problem of peeling of the opaque or light sensitive material is eliminated.

40 Claims, 3 Drawing Sheets

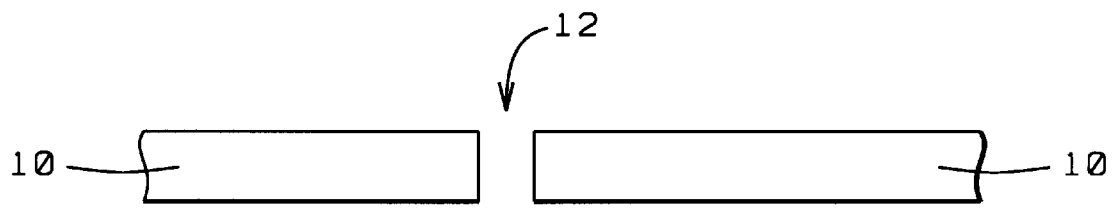
FIG. 1a – Prior Art
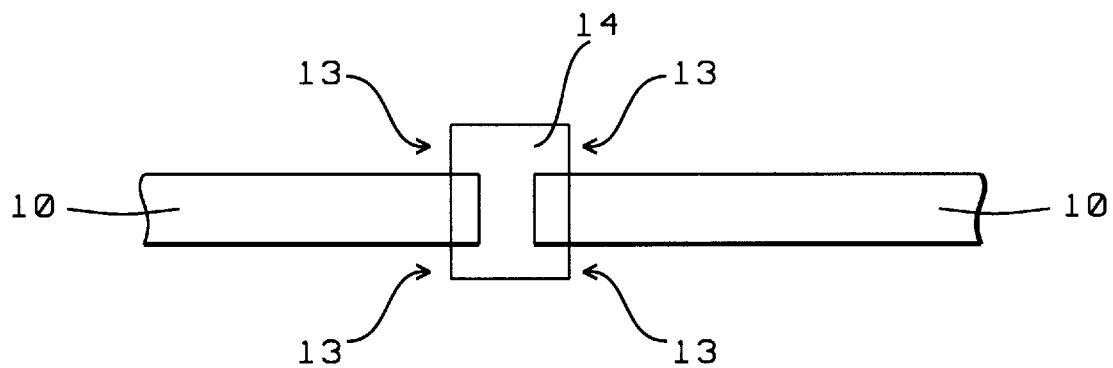
FIG. 1b – Prior Art
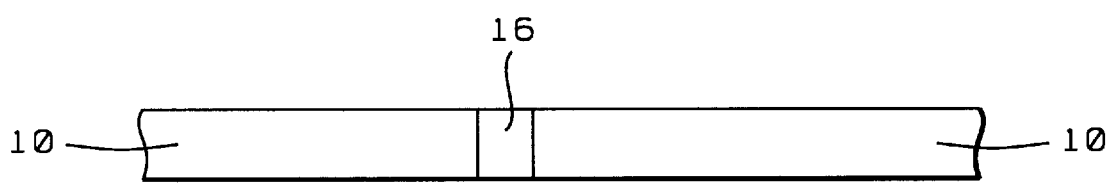
FIG. 1c – Prior Art
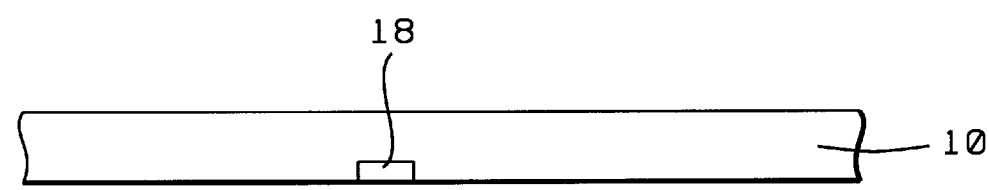
FIG. 2a – Prior Art

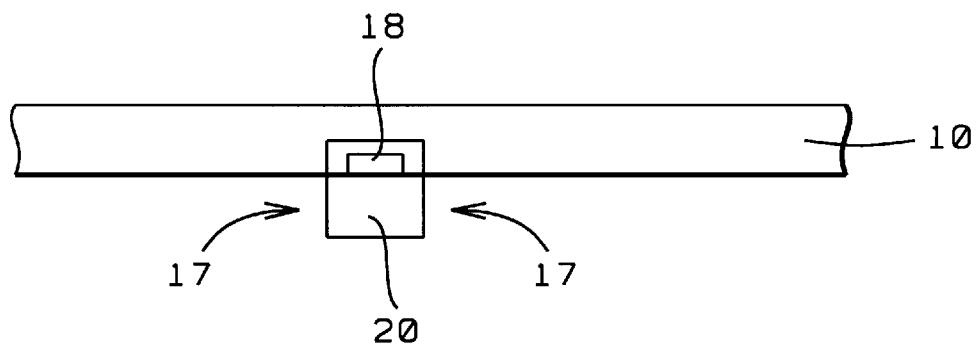
FIG. 2b – Prior Art
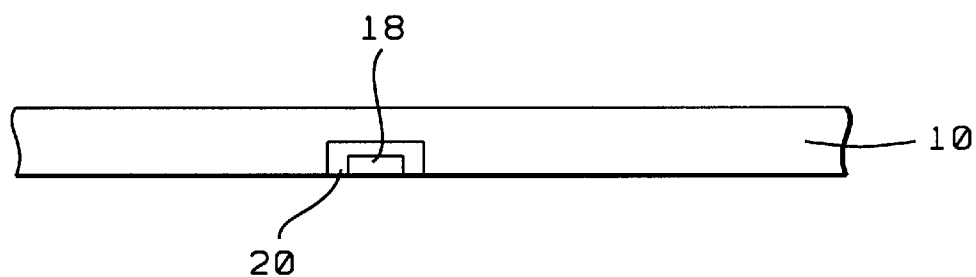
FIG. 2c – Prior Art
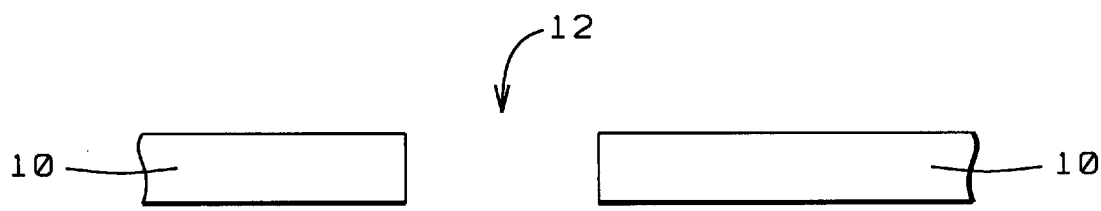
FIG. 3a – Prior Art
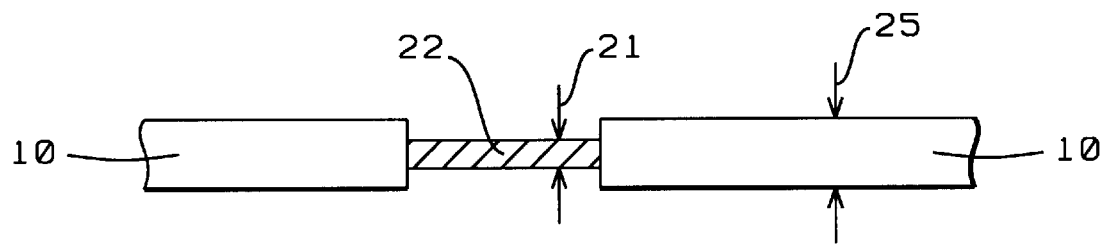
FIG. 3b – Prior Art

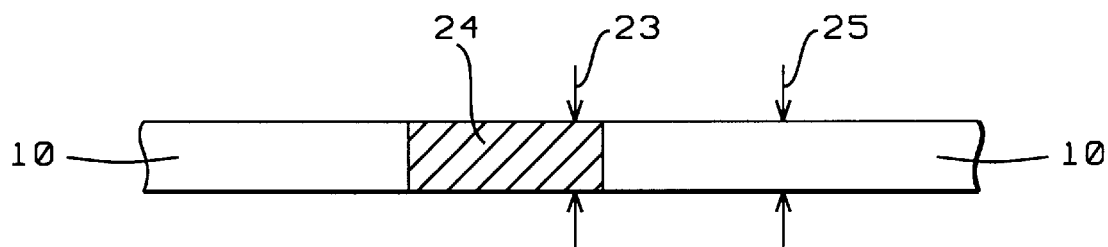
FIG. 3c — Prior Art
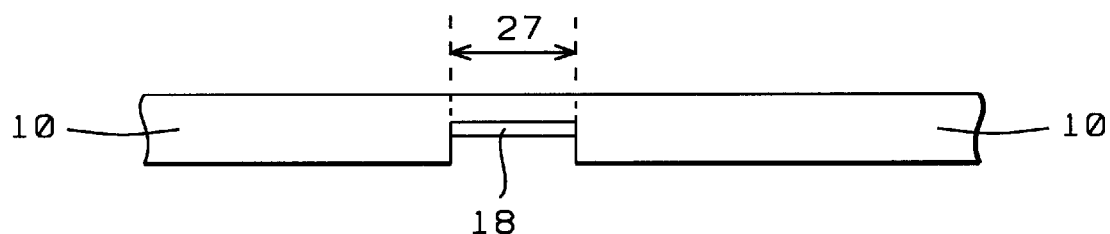
FIG. 4a — Prior Art
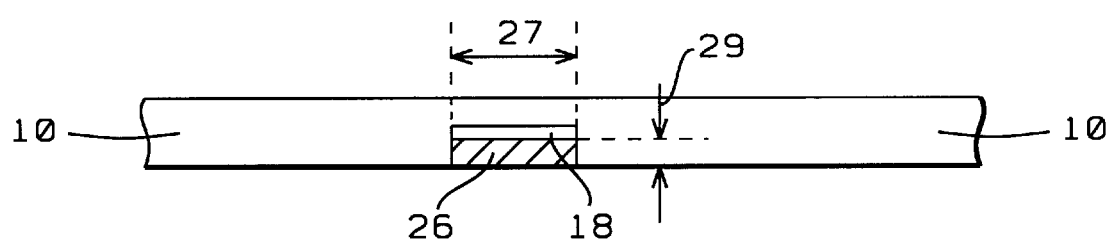
FIG. 4b — Prior Art
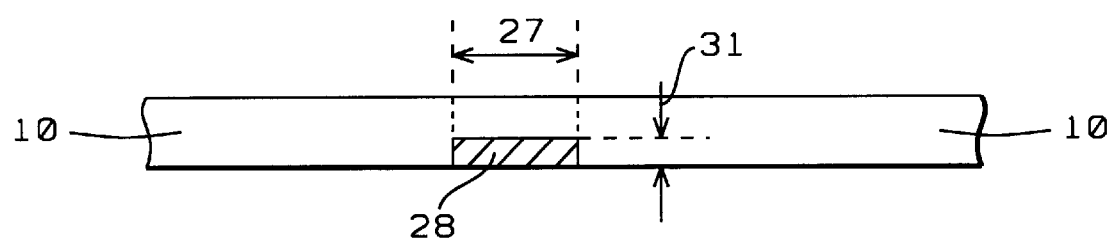
FIG. 4c — Prior Art

QUARTZ DAMAGE REPAIR METHOD FOR HIGH-END MASK

BACKGROUND OF THE INVENTION (1) Field of the Invention

The invention relates to the fabrication of integrated circuit devices, and more particularly, to a method or repairing damaged high-end quartz masks.

(2) Description of the Prior Art

One of the most essential components that is used during the process of performing photolithographic exposures is a photomask that contains patterns that need to be transposed from the mask to underlying layers of semiconductor material such as most notably the surface of a layer of photoresist. The standard mask comprises a transparent substrate on the surface of which a patterned layer of opaque material has been created. Typically used for the opaque material is chromium that has been deposited over the quartz substrate to a thickness of about 1,000 Angstrom. Alternate opaque materials for the creation of the patterned layer on the surface of a photolithographic mask are nickel and aluminum. For the substrate most typically is used quartz whereby however glass and sapphire can also be used for this purpose. More sophisticated photo masks apply the principle of phase shifting of the light as the light passes through the mask and are applied for use in creating device features of sub-micron dimensions, where projected light that is in extreme close proximity mutually influences adjacent light, having a detrimental effect on the formation of the exposed patter. As a further advance, alternate phase shifting masks can be used, where the phase shifting characteristic of the phase shifting mask is alternately applied to the light as the light passes through the photo mask. A further level of sophistication is introduced by the use of regions on the surface of the substrate of the photomask that pass light in a graded manner. Light passing characteristics of the mask can in this case be adjusted so that not only complete passing or complete blocking of light takes place but so that the mask provides a graded exposure that may for instance be of use in creating dual damascene structures, where depth of light exposure can be used for non-uniform removal of a layer of photoresist over the thickness of the layer of photoresist.

The photolithographic mask is created using conventional methods of depositing (including sputtering) a layer of opaque material over a surface of the substrate of the mask and patterning this layer using conventional high resolution methods of exposure such as E-beam exposure. Due to the frequently used high density of the pattern that is developed in the layer of opaque material, this formation is exposed to a number of problems that result in bad and unusable masks. These masks are frequently repaired, based on a cost analysis as to whether it is best (most cost effective) to repair the mask or whether it is best to scrap the defective mask. Some of the defects that can occur in the creation of a opaque pattern over the surface of the substrate are opaque material remaining in place where it should be removed and visa versa, the formation of an interconnect or bridge between closely spaced adjacent lines of the opaque pattern, extensions of the opaque material into transparent surface regions of the mask, the occurrence of an isolated opaque spot in a transparent region and visa versa, the formation of pin holes in either the opaque or the transparent surface area and the like.

A number of methods have been provided for the repair of photo masks. In view of the density and the potential complexity of the pattern that has been created on the substrate of the photo mask, this process however can be cumbersome, time consuming and expensive. The invention provides a method that is reliable and can be readily made part of a semiconductor manufacturing environment.

U.S. Pat. No. 6,190,836 B1 (Grenon et al.) discloses a method for repairing a photomask.

U.S. Pat. No. 6,103,430 (Yang) reveals a method to repair a PSM.

U.S. Pat. No. 5,965,301 (Nara et al.) shows a method to remove a residual defect in a mask.

U.S. Pat. No. 5,965,303 (Huang) shows another PSM repair method.

SUMMARY OF THE INVENTION

A principle objective of the invention is to provide a method of repairing photolithographic exposure masks that is cost effective to implement.

Another objective of the invention is to provide a method of repairing photolithographic exposure masks that has high accuracy of repair.

Yet another objective of the invention is to provide a method of repairing photolithographic exposure masks that eliminates concerns of peeling of opaque material after the repair has been performed.

In accordance with the objectives of the invention a new method is provided for repairing photolithographic exposure masks. The invention uses an etch function of a conventional mask repair tool. The invention addresses defects that occur in a pattern of opaque material (such as chrome) created over the surface of an exposure mask whereby an (undesired) opening exists in the opaque material. The invention uses a focused E-beam exposure of the surface of the exposure mask to purposely "damage" this surface over the area where the opaque material is required to be present. Repair accuracy is in this manner easy to control, the conventional problem of peeling of the opaque or light sensitive material is eliminated.

BRIEF DESCRIPTION OF THE DRAWINGS

FIGS. 1a through 1c show conventional repair of a clear or open line defect.

FIGS. 2a through 2c show conventional repair of an opaque or intrusion defect.

FIGS. 3a through 3c show repair of a clear or open line defect in accordance with the invention.

FIGS. 4a through 4c show repair of an opaque or intrusion defect in accordance with the invention.

DESCRIPTION OF THE PREFERRED EMBODIMENTS

Required improvements in semiconductor product performance can only be achieved by designing devices with ever decreasing device dimensions. The smaller dimensions that are required for advanced semiconductor devices can only be achieved if these smaller dimensions are reflected in the photolithographic imaging masks that are used to create the device features of reduced dimensions. Photolithographic masks must therefore be designed having on the surface thereof smaller and higher-density patterns. This brings with it that repair of a pattern on the surface of a mask is more difficult, using current repair methods and tools, for advanced, deep sub-micron semiconductor devices.

Typical repairs of a chromium or phase shift mask address two problems that are experienced with these mask, that is clear defects in which portions of the light-absorbing chromium are missing and opaque defect or defects of intrusion in which extra chromium is located on the quartz substrate. Current practice uses a Focused Ion Beam (FIB) tool to affect the repair, clear defects are repaired with E-beam induced deposits of an opaque carbon film of for instance polystyrene while opaque defects are repaired by sputtering away the excess and misplaced chromium deposits.

These current repair methods face two significant shortcomings:

the accuracy of deposition is limited for smaller, denser patterns, resulting in over-deposition of the carbon film which creates a large effective Critical Dimension of the corrected line pattern, and the deposited material tends to peel after deposition and after normal clean.

In repairing a clear defect in the opaque surface area of a mask, there is a limit to the accuracy of the deposition of the corrective material that is typically required for repairing of the clear defect. It is common to experience over-diffusion or spreading of the deposited corrective material that is applied to correct a clear defect. That is the deposited material will diffuse over the surface of the exposed, normal quartz area. This diffusion is corrected by etching the surface of the quartz substrate in order to remove the diffused materials from this surface. The etching of the diffused surface area of the quartz mask however typically results in damage to the surface of the quartz substrate, creating a surface area of low or no transmittance where in fact this surface area is supposed to be a clear or light transmitting surface area. This surface area, of an impaired light passing capabilities, will become part of the exposing surface area of the mask, leading to exposures that are either of low quality or that are unacceptable.

The current method of repairing a broken line of chromium over the surface of a photolithographic mask is shown in FIGS. 1a through 1c, as follows, FIG. 1a:

10 is the line that must be repaired 12 is the opening or interruption in line 10 which must be repaired, further, FIG. 1b:

14 is the material (chromium) that has been deposited over the surface of the quartz substrate in order to repair opening 12

13 are the surface areas of the quartz substrate over which the repair material (chromium) is deposited where this repair material is not required for the repair of opening 12; the repair material must be removed from these surface areas 13, the surface areas 13 can substantially be described as the surface areas of the quartz substrate over which excess, not needed repair material 14 has been deposited; surface areas 13 therefore are areas of deposition of repair material 14 that fall outside the surface area of the quartz substrate over which the undamaged line 10 existed, further FIG. 1c:

16, the remaining repair material after excess repair material has been removed from the previously highlighted surface areas 13 of the quartz substrate.

The surface of the quartz substrate that underlies the areas 13 is the surface that is typically damaged due to the etch that is required to remove the excess repair material from areas 13.

FIGS. 2a through 2c show the-prior art process for the repair of, FIG. 2a, an intrusion 18 onto the line 10. A layer 20, FIG. 2b, of repair material is deposited over the intrusion 18 and etched from surface areas 17 where the repair material does not cover the surface of the undamaged line 10, FIG. 2c. The surface area of the quartz substrate from which the excess repair material has been removed is in this case equally prone to damage, resulting in a mask having impaired light transmitting characteristics.

The above highlighted surface regions 13 (FIG. 1b) and 17 (FIG. 2b) are the depositions of the chromium where this chromium does not accurately overlay the opening 12 (FIG. 1a) or the intrusion 18 (FIG. 2a). The corrective layers 16 of FIG. 1c and 20 of FIG. 2c are, as previously stated, prone to peel from the surface of the mask, causing new and perhaps even more serious concerns relating to the usability of the photo mask even after the repair of the mask has been completed.

The etch process that is typically used for the removal of excess deposited chromium uses as etch components Ga or $Br_2$ for binary mask or $XeF_2$ for a PSM mask and $SiO_2$. Of these etch components the elements Ga and $Br_2$ or $XeF_2$ are known to chemically interact with the surface of the quartz substrate of the mask, causing the above to referred to damage to the quartz.

The invention provides a method that addresses the above stated issues and that overcomes the highlighted difficulties for the repair of advanced masks. The invention addresses the repair of clear and opaque defects by utilizing the etch function of a standard repair tool. The invention damages the surface of the exposure mask over the surface area where the opaque material, such as chrome, is supposed to be present. This "damage" of the surface of the quartz exposure mask is achieved using a Focused Ion Beam (F.I.B.) tool. By selectively exposing the surface of the quartz exposure mask using the F.I.B tool, the exposed surface area will be converted to an opaque surface, thus replacing the opaque function of the (missing) opaque material over the surface of the quartz exposure mask.

The method of the invention is referred to as the Quartz-Damage Repair (QDR) method, which will now be explained in detail.

FIGS. 3a through 3c and FIGS. 4a through 4c are used to further explain the invention.

Shown in FIG. 3a are:

10, the line that must be repaired 12, the opening or interruption in line 10 which must be repaired, further, FIG. 3b:

22, the area of the quartz that is exposed due to the opaque material, such as chrome, not being present over this surface area (a chrome defect); this surface area is targeted for an etch using the F.I.B. etch tool; the target area 22 is etched, preferably over the length of the opening but preferably only over a width 21 that is between about ⅔ and ¾ of the width 25 of the opening 12, and 24, the resulting damaged quartz area after the F.I.B. etch, which has a width 23 that is approximately equal to the width 25 of the chrome pattern.

The mask that is shown in cross section in FIG. 3a has been described as being a mask that uses quartz as the material for the substrate of the mask. This mask however is not limited to using quartz as the material for the substrate of the mask but can equally make use of glass and sapphire for the creation of the substrate of the mask. In addition, the mask may be a binary mask or a phase-shift mask of a gray-tone mask that provides grade light passing capabilities from transparent to opaque and any intermediate degree of light blocking for a pattern or parts of a pattern on the surface of the mask.

A brief overview of the creation of a phase shift mask is of value at this time. A layer of opaque material such as chromium is deposited over the substrate of the mask, typically of quartz or other silica based material. The chromium is etched, creating a pattern in the chromium. The quartz of the substrate is etched in a fluorine based plasma, using the resist of the etch of the chromium as a mask. The resist is then stripped, the chromium is removed by a dry or wet process leaving the phase shift mask of quartz etched in the quartz substrate of the mask.

As an alternate to etching the pattern for the phase shift mask in the surface of the substrate, a layer of phase shifter material can be deposited on this surface and can be patterned and etched using conventional methods to create the pattern of phase shifter material. Gray-tone masks (GTM) can in similar manner be created by creating layers of varying light passing characteristics on the surface of the substrate of the exposure mask, by varying the thickness of the overlying layers on the surface of the mask the light density that is allowed to pass through the mask can be made to vary.

The above-indicated sequence of repairing an interrupted line of chromium on the surface of a quartz substrate has the following advantages, some of which have already been highlighted:

the accuracy of the repair is improved since this accuracy is now determined by the etch accuracy of the quartz that is used for purposes of repair; an overetch can be applied is this is desired, whereby with overetch is implied that the etch may damage the quartz from an area that surrounds the actual interruption of chromium in the interrupted line; this overetch does not introduce any negative effects but allows a relaxation of requirements of accuracy for the applied etch typically experienced peeling of the deposited materials (such as polystyrene) that has been deposited in order to affect a repair is eliminated; this since the etch of the invention does not apply any new material the most stringent requirements of accuracy that is required for the repair are placed on the tool that affects the etch of the quartz.

FIGS. 4a through 4c show a process for repair of an intrusion that is similar to the process highlighted above for a broken line, as follows, FIG. 4a:

10, the line that must be repaired 18, an intrusion defect in line 10 which must be repaired, intrusion defect 18 has a length of 27, further, FIG. 4b:

26, the F.I.B target area of quartz damage, having a length 27 and a width of 29, further, FIG. 4c:

28, the final dimension of the damaged quartz where the quartz has been converted to a non-light transmitting or opaque surface, having a length of 27 and a width 31 that is equal to between about ⅔ and ¾ the value of 29 (FIG. 4b).

Experimental results have been obtained in order to confirm the effectiveness of the invention. These experimental results are shown next and have been obtained using a Micro-lithography Simulation Microscope (MSM). The Critical Dimensions (CD) of lines have been measure using the MSM, a target CD of 0.2 $\mu$m has been used for comparative purposes. A broken line has been repaired using the invention, measured after the repair has been performed was a CD value of 0.204 $\mu$m. Further, a line having an intrusion has been repaired using the invention, measured after the repair has been performed was a CD value of 0.198 $\mu$m. It has been found that the CD of repaired lines using the invention is between 2 and 4 nm different than the CD of non-damaged lines.

These results, in addition to the gained advantages of elimination peeling of deposited opaque materials, make the method of the invention suitable for the repair of photolithographic masks that are used for the creation of deep sub-micron line and other patterns.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of repairing a photolithography mask, said mask being used for the creation of device features having deep-sub-micron dimensions, comprising the steps:

providing a photolithographic mask, said photolithographic mask comprising a pattern of light sensitive material created on the surface thereof, said pattern of light sensitive material comprising at least one line pattern having a width, said at least one line pattern comprising at least one interruption of said at least one line pattern, said at least one interruption having a length, said at least one interruption of said at least one line pattern comprising a damaged line pattern; and etching the surface of said photolithographic mask over the surface of said at least one interruption, said etching extending over a length about equal to said length of said at least one interruption and over a width equal to between about ⅔ and ¾ of said width of said at least one line pattern.

2. The method of claim 1, said light sensitive material comprising opaque material.

3. The method of claim 2, said opaque material comprising chromium.

4. The method of claim 3, said chromium being deposited to a thickness of about 1,000 Angstrom.

5. The method of claim 2, said opaque material comprising nickel.

6. The method of claim 5, said nickel being deposited to a thickness of about 1,000 Angstrom.

7. The method of claim 2, said opaque material comprising aluminum.

8. The method of claim 7, said aluminum being deposited to a thickness of about 1,000 Angstrom.

9. The method of claim 1, said photolithographic mask comprising quartz for a substrate for said mask.

10. The method of claim 1, said photolithographic mask comprising glass for a substrate for said mask.

11. The method of claim 1, said photolithographic mask comprising sapphire for a substrate for said mask.

12. The method of claim 1, said photolithographic mask being a binary mask.

13. The method of claim 1, said light sensitive material comprising phase shifter material, making said photolithographic mask a phase shift mask.

14. The method of claim 1, said light sensitive material having graded light passing characteristics, making said photolithographic mask a Gray-Tone mask.

15. A method of repairing a photolithography mask, said mask being used for the creation of device features having deep-sub-micron dimensions, comprising the steps:

providing a photolithographic mask, said photolithographic mask comprising a pattern of light sensitive material created on the surface thereof, said pattern of light sensitive material comprising at least one line pattern, said at least one line pattern comprising at least one extrusion of light sensitive material, said at least one extrusion having a length and a width, said at least one extrusion of light sensitive material comprising a damaged line pattern; and etching using a Focused Ion Beam tool the surface of said photolithographic mask over the surface of said at least one extrusion, said etching extending over a length about equal to said length of said at least one extrusion and over a width equal to between about ⅔ and ¾ of said width of said at least one extrusion.

16. The method of claim 15, said light sensitive material comprising opaque material.

17. The method of claim 16, said opaque material comprising chromium.

18. The method of claim 17, said chromium being deposited to a thickness of about 1,000 Angstrom.

19. The method of claim 16, said opaque material comprising nickel.

20. The method of claim 19, said nickel being deposited to a thickness of about 1,000 Angstrom.

21. The method of claim 16, said opaque material comprising aluminum.

22. The method of claim 21, said aluminum being deposited to a thickness of about 1,000 Angstrom.

23. The method of claim 15, said photolithographic mask comprising quartz for a substrate for said mask.

24. The method of claim 15, said photolithographic mask comprising glass for a substrate for said mask.

25. The method of claim 15, said photolithographic mask comprising sapphire for a substrate for said mask.

26. The method of claim 15, said photolithographic mask being a binary mask.

27. The method of claim 15, said light sensitive material comprising phase shifter material, making said photolithographic mask a phase shift mask.

28. The method of claim 15, said light sensitive material having graded light passing characteristics, making said photolithographic mask a Gray-Tone mask.

29. A method of repairing a photolithography mask, said mask being used for the creation of device features having deep-sub-micron dimensions, comprising the steps:

providing a photolithographic mask, said photolithographic mask comprising a pattern of light sensitive material created on the surface thereof, said pattern of light sensitive material comprising at least one line pattern having a first width, said at least one line pattern comprising at least one interruption of said at least one line pattern, said at least one interruption having a first length, said at least one interruption of said at least one line pattern comprising a damaged line pattern; and etching the surface of said photolithographic mask over the surface of said at least one interruption, said etching extending over a second length and over a second width.

30. The method of claim 29, the second length being equal to about said first length of said at least one interruption, the second width being equal to between about ⅔ and ¾ of said first width of said at least one line pattern.

31. The method of claim 29, said photolithographic mask being a binary mask.

32. The method of claim 29, said light sensitive material comprising phase shifter material, making said photolithographic mask a phase shift mask.

33. The method of claim 29, said light sensitive material having graded light passing characteristics, making said photolithographic mask a Gray-Tone mask.

34. The method of claim 29, said etching comprising F.I.B. technology.

35. A method of repairing a photolithography mask, said mask being used for the creation of device features having deep-sub-micron dimensions, comprising the steps:

providing a photolithographic mask, said photolithographic mask comprising a pattern of light sensitive material created on the surface thereof, said pattern of light sensitive material comprising at least one line pattern, said at least one line pattern comprising at least one extrusion of light sensitive material, said at least one extrusion having a first length and a first width, said at least one extrusion of light sensitive material comprising a damaged line pattern; and etching the surface of said photolithographic mask over the surface of said at least one extrusion, said etching extending over a second length and over a second width.

36. The method of claim 35, said second length being about equal to said first length of said at least one extrusion, said second width being equal to between about ⅔ and ¾ of said first width of said at least one extrusion.

37. The method of claim 35, said photolithographic mask being a binary mask.

38. The method of claim 35, said light sensitive material comprising phase shifter material, making said photolithographic mask a phase shift mask.

39. The method of claim 35, said light sensitive material having graded light passing characteristics, making said photolithographic mask a Gray-Tone mask.

40. The method of claim 35, said etching comprising F.I.B. technology.

* * * * *